US010383221B1

(12) United States Patent
Sugiyama et al.

(10) Patent No.: US 10,383,221 B1
(45) Date of Patent: Aug. 13, 2019

(54) FLEXIBLE CIRCUIT BOARD

(71) Applicant: SHARP KABUSHIKI KAISHA, Sakai, Osaka (JP)

(72) Inventors: Ryohsuke Sugiyama, Sakai (JP); Takayuki Yanagi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/169,918

(22) Filed: Oct. 24, 2018

(30) Foreign Application Priority Data

Feb. 15, 2018 (JP) ................ 2018-025208

(51) Int. Cl.
*H01R 12/59* (2011.01)
*H05K 1/03* (2006.01)
*H05K 1/11* (2006.01)
*H05K 1/02* (2006.01)

(52) U.S. Cl.
CPC ......... *H05K 1/0393* (2013.01); *H05K 1/0281* (2013.01); *H05K 1/11* (2013.01)

(58) Field of Classification Search
None
See application file for complete search history.

(56) References Cited

U.S. PATENT DOCUMENTS

| | | | | | |
|---|---|---|---|---|---|
| 5,444,188 | A | * | 8/1995 | Iwayama | H01L 23/5387 174/261 |
| 5,590,465 | A | * | 1/1997 | Santo | H05K 1/118 174/254 |
| 7,128,596 | B2 | * | 10/2006 | Masaki | H01R 13/506 439/492 |
| 7,345,244 | B2 | * | 3/2008 | Shiraishi | H01R 4/02 174/254 |
| 7,455,531 | B2 | * | 11/2008 | Hirabayashi | H01R 13/025 174/154 |
| 8,410,372 | B2 | * | 4/2013 | Kinoshita | H01M 10/4257 174/254 |
| 2007/0095562 | A1 | * | 5/2007 | Tsai | H05K 1/0281 174/254 |

FOREIGN PATENT DOCUMENTS

JP   H06-152077 A   5/1994

* cited by examiner

*Primary Examiner* — Dimary S Lopez Cruz
(74) *Attorney, Agent, or Firm* — ScienBiziP, P.C.

(57) ABSTRACT

An aspect of the present invention makes it possible to reduce stress at a boundary between a coverlay and a terminal section of a flexible circuit board and reduce the possibility of disconnection in the terminal section in the flexible circuit board. An aspect of the present invention provides a flexible circuit board including: a reinforcing plate bonded to a whole of a terminal section and a portion of a coverlay; and a flexible plate including a holding portion and a bonding portion, the flexible plate bonding to the coverlay via only the bonding portion, the flexible plate being spaced apart from the reinforcing plate.

7 Claims, 4 Drawing Sheets

FLEXIBLE CIRCUIT BOARD

This Nonprovisional application claims priority under 35 U.S.C. § 119 on Patent Application No. 2018-025208 filed in Japan on Feb. 15, 2018, the entire contents of which are hereby incorporated by reference.

TECHNICAL FIELD

The present invention relates to a flexible circuit board, in particular, to a flexible circuit board including a terminal section.

BACKGROUND ART

Patent Literature 1 discloses a technique for preventing a disconnection in a conductor pattern of a flexible board including a terminal section, in which flexible board a reinforcing plate is provided on a back side of a base film on which the conductor pattern is formed. In the technique, in order to prevent the disconnection, rigidity of the reinforcing plate is decreased so that curvature deformation of the flexible board will easily occur.

CITATION LIST

Patent Literature

[Patent Literature 1]
Japanese Patent Application Publication, Tokukaihei, No. 6-152077 (1994)

SUMMARY OF INVENTION

Technical Problem

As a possible application of the technique disclosed in Patent Literature 1, there is a configuration in which the reinforcing plate is caused to function as a holding portion, and when the terminal section is handled, the reinforcing plate is held. This makes it possible to easily attach/detach the terminal section. Patent Literature 1 however takes into consideration neither holding of the reinforcing plate nor stress caused by bending of the reinforcing plate in a direction away from the base film.

For example, in one possible configuration, one reinforcing plate is bonded to an upper surface formed by (i) a coverlay in which a conductor pattern is provided and (ii) a terminal section where the conductor pattern is exposed from the coverlay, and a portion of the reinforcing plate is used as a holding portion. In this case, stress is produced at a boundary between the terminal section and the coverlay due to bending of the reinforcing plate at the time when the holding portion is held. This may lead to a disconnection in the conductor pattern.

Solution to Problem

In order to solve the above problem, a flexible circuit board in accordance with an aspect of the present invention is configured to include: a coverlay in which a conductor pattern is provided; a terminal section including the conductor pattern which is exposed from the coverlay; a reinforcing plate being provided at one of an upper surface and a lower surface of the flexible circuit board and bonded to a whole of the terminal section and a portion of the coverlay; and a flexible plate including a holding portion and a bonding portion, the bonding portion being provided on a terminal section side of the flexible plate relative to the holding portion, the flexible plate bonding, at the one surface of the flexible circuit board, to the coverlay via only the bonding portion, the flexible plate being spaced apart from the reinforcing plate in a direction from the terminal section to the coverlay.

Advantageous Effects of Invention

An aspect of the present invention advantageously makes it possible to provide a flexible circuit board which reduces stress at a boundary between a coverlay and a terminal section in a case where a flexible plate bends and the coverlay bends accordingly.

DESCRIPTION OF EMBODIMENTS

Embodiment 1

In the description of the present specification, surfaces of a flexible circuit board are defined as follows: (i) a lower surface of the flexible circuit board is a surface where a conductor pattern of a terminal section is exposed; and (ii) an upper surface of the flexible circuit board is another surface opposite to the lower surface, to which another surface a reinforcing plate and a flexible plate are bonded.

Figure 1:
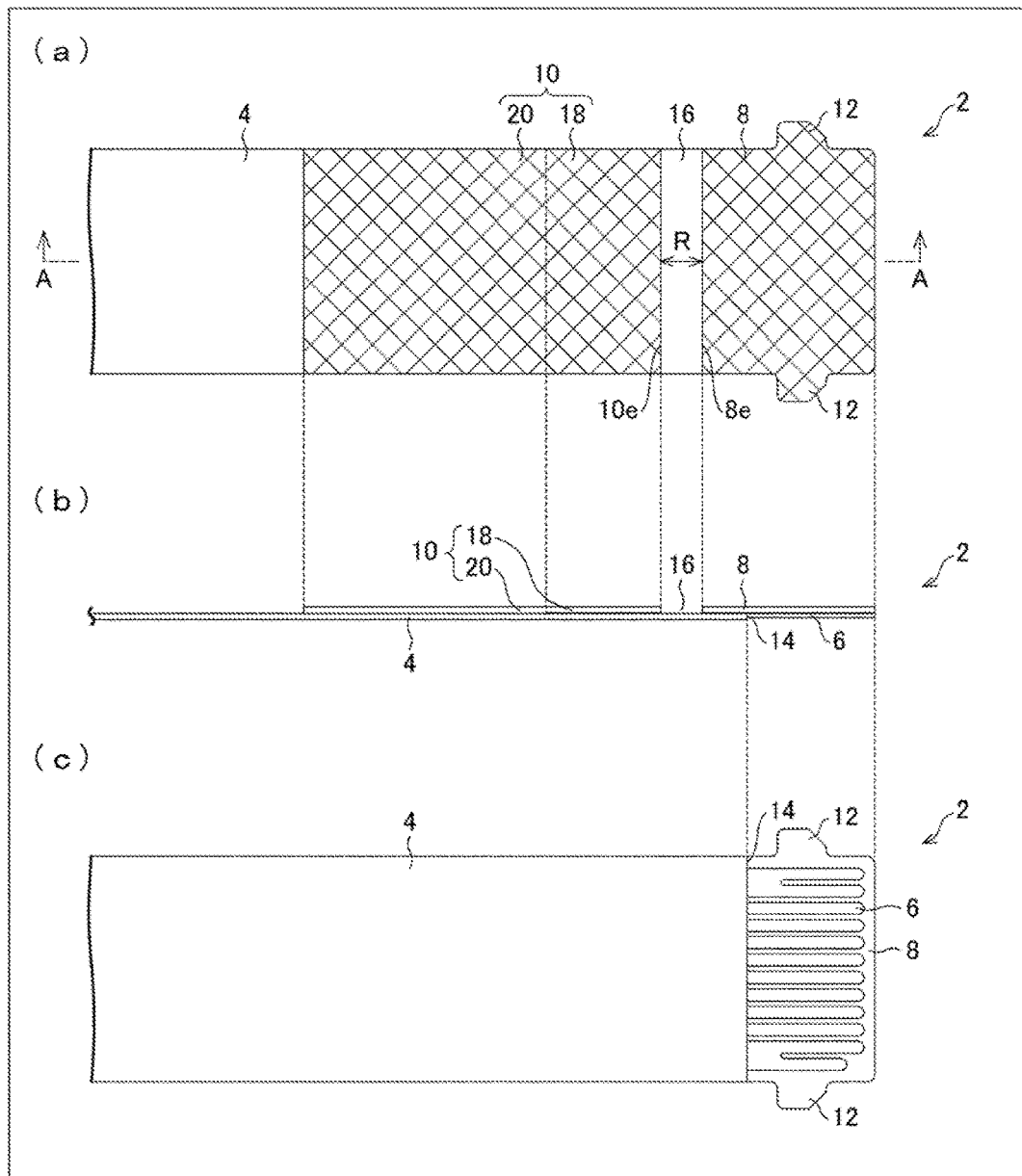
FIG. 1 is a schematic view illustrating an upper surface, a lengthwise cross section, and a lower surface of a flexible circuit board in accordance with Embodiment 1 of the present invention.

FIG. 1 is a schematic view for explaining a flexible circuit board 2 in accordance with Embodiment 1 of the present invention. (a) of FIG. 1 is a top view of the flexible circuit board 2. (b) of FIG. 1 is a cross-sectional view taken along the line A-A in (a) of FIG. 1. (c) of FIG. 1 is a bottom view of the flexible circuit board 2. The flexible circuit board 2 is illustrated such that the position of a terminal side end of the flexible circuit board 2 is aligned in (a) to (c) of FIG. 1. Therefore, the flexible circuit board 2 is illustrated such that the positions of the flexible circuit board 2 in a longitudinal direction of the flexible circuit board 2 correspond to one another in (a) to (c) of FIG. 1.

The flexible circuit board 2 in accordance with Embodiment 1 includes a coverlay 4 and a terminal section 6, as illustrated in (c) of FIG. 1. In the coverlay 4, a conductor pattern of the flexible circuit board 2 is provided. Accordingly, the coverlay 4 functions to protect the conductor pattern. The coverlay 4 contains a flexible material and easily bends when an external force is applied to the coverlay 4. The terminal section 6 includes an end portion of the conductor pattern which is exposed from the coverlay 4. In Embodiment 1, the terminal section 6 serves as an insertion terminal of the flexible circuit board 2. The flexible circuit board 2 may be mounted to an external device by insertion of the terminal section 6 into a terminal of the external device.

At either surface of the flexible circuit board 2, the flexible circuit board 2 further includes a reinforcing plate 8 and a flexible plate 10. In Embodiment 1, the reinforcing plate 8 and the flexible plate 10 are provided at the upper surface illustrated in (a) of FIG. 1. The reinforcing plate 8 and the flexible plate 10 are bonded to upper surfaces of the coverlay 4 and the terminal section 6 of the flexible circuit board 2.

The reinforcing plate 8 is attached to an end portion of the flexible circuit board 2 which end portion is located on a terminal section 6 side. The reinforcing plate 8 is attached such that an entire lower surface of the reinforcing plate 8 is bonded to the end portion. The reinforcing plate 8 may have hooks 12 on respective side surfaces of the reinforcing plate 8, which hooks 12 fit into a terminal of an external device when the terminal section 6 is mounted by insertion to the external device. The reinforcing plate 8 is bonded to a position in which the reinforcing plate 8 overlaps a whole of the terminal section 6 and a portion of the coverlay 4, when viewed from above. In other words, a full surface of the reinforcing plate 8 is bonded to an area including the whole of the terminal section 6, the portion of the coverlay 4 and a boundary 14 between the coverlay 4 and the terminal section 6. The reinforcing plate 8 reinforces structural strength of the coverlay 4 and of the terminal section 6. Therefore, the reinforcing plate 8 preferably contains a material having a predetermined level of rigidity.

The flexible plate 10 is spaced apart from the reinforcing plate 8 by a gap 16, in a direction from the terminal section 6 to the coverlay 4. The gap 16 is defined as a space between a coverlay-4 side edge 8e of the reinforcing plate 8 and a terminal-section-6 side edge 10e of the flexible plate 10. In Embodiment 1, when viewed from above, the coverlay-4 side edge 8e and the terminal-section-6 side edge 10e are each in the shape of a straight line and therefore, the gap 16 has a rectangular shape. The width of the gap 16, that is, a distance between the coverlay-4 side edge 8e and the terminal-section-6 side edge 10e is defined as a length R.

The flexible plate 10 includes a bonding portion 18 and a holding portion 20. A full lower surface of the bonding portion 18 is bonded to a portion of the upper surface of the coverlay 4. The position where the bonding portion 18 is bonded is closer to the terminal section 6 than the position of the holding portion 20. Since the holding portion 20 is not bonded to the coverlay 4, the flexible plate 10 bonds to the coverlay 4 via only the bonding portion 18. When an external force is applied to the holding portion 20 in a direction away from the coverlay 4 along a vertical direction, that is, when an external force is applied to the holding portion 20 in an upward direction away from the coverlay 4 in FIG. 1, the holding portion 20 of the flexible plate 10 moves apart from the coverlay 4 and as a result, the flexible plate 10 bends upward.

The dotted line in the flexible plate 10 in FIG. 1 indicates a boundary between the bonding portion 18 and the holding portion 20. In other words, the flexible plate 10 is bonded to the coverlay 4 by a portion which is closer to the terminal section 6 than the dotted line. Meanwhile, another portion of the flexible plate 10, which another portion is farther from the terminal section 6 than the dotted line, is not bonded to the coverlay 4. Accordingly, that another portion of the flexible plate 10 can bend in the direction away from the coverlay 4.

The flexible plate 10 may contain a material that is the same as that contained in the reinforcing plate 8. Note, however, that preferably, the flexible plate 10 is bent by an external force applied to the holding portion 20 and when the external force is removed, restores to a substantially original shape. Therefore, the flexible plate 10 preferably contains a material having predetermined levels of rigidity and elasticity.

Figure 2:
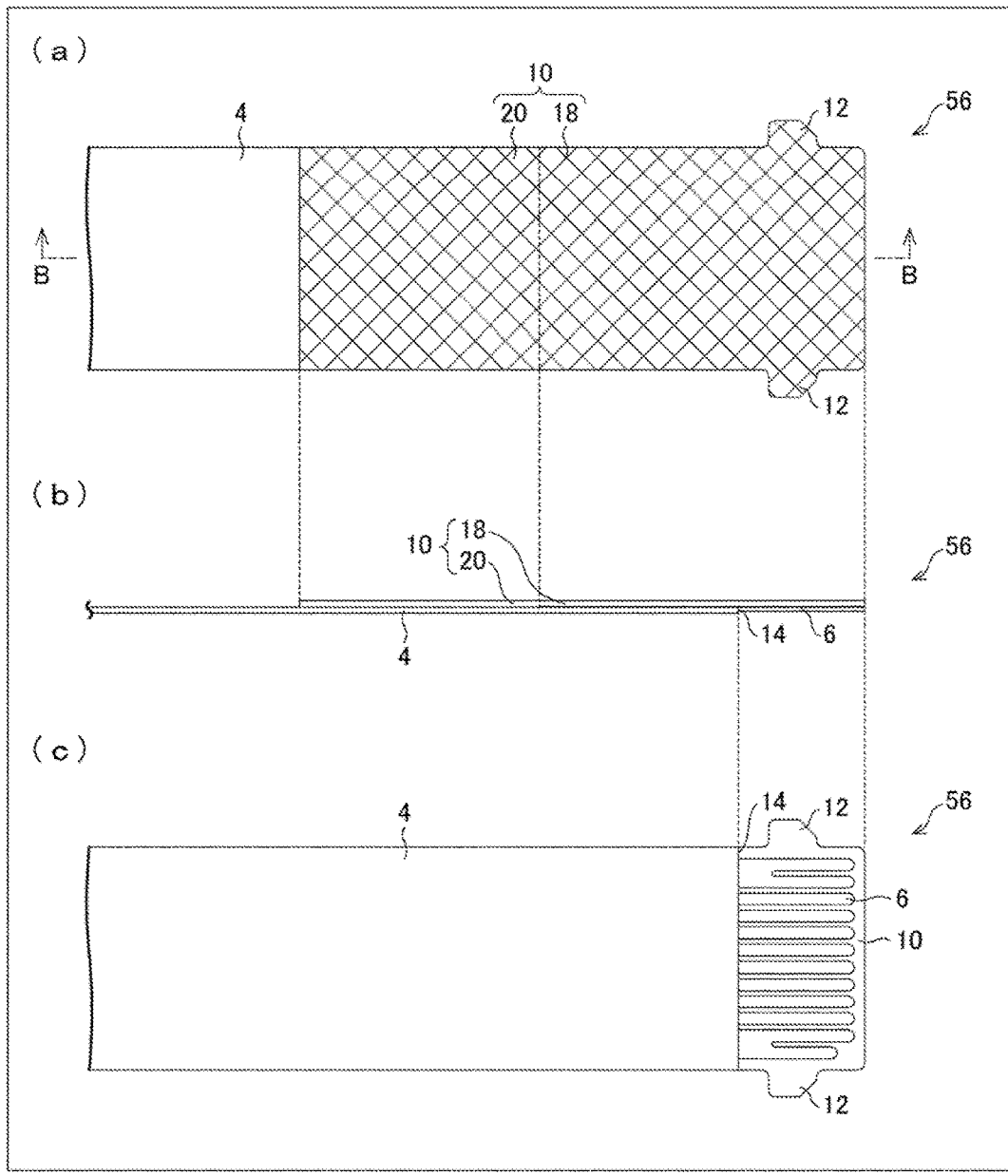
FIG. 2 is a schematic view illustrating an upper surface, a lengthwise cross section, and a lower surface of a flexible circuit board in accordance with a Comparative Embodiment.

The following will discuss an effect produced by the flexible circuit board 2 in accordance with Embodiment 1, in comparison with a flexible circuit board in accordance with a Comparative Embodiment. FIG. 2 is a view illustrating a flexible circuit board 56 in accordance with the Comparative Embodiment. Positions of the flexible circuit board 56 in (a) to (c) of FIG. 2 correspond to those of the flexible circuit board 2 in (a) to (c) of FIG. 1, respectively. Further, (b) of FIG. 2 is a cross-sectional view taken along the line B-B in (a) of FIG. 2.

The flexible circuit board 56 in accordance with the Comparative Embodiment is different in configuration from the flexible circuit board 2 in accordance with Embodiment 1 in that the flexible circuit board 56 does not include the reinforcing plate 8. Accordingly, in the flexible circuit board 56, a full surface of a bonding portion 18 of a flexible plate 10 is bonded to an area including a whole of a terminal section 6, a portion of a coverlay 4, and a boundary 14 between the coverlay 4 and the terminal section 6. The bonding portion 18 has hooks 12. Except for the above point, the flexible circuit board 56 may be identical in configuration to the flexible circuit board 2.

Figure 3:
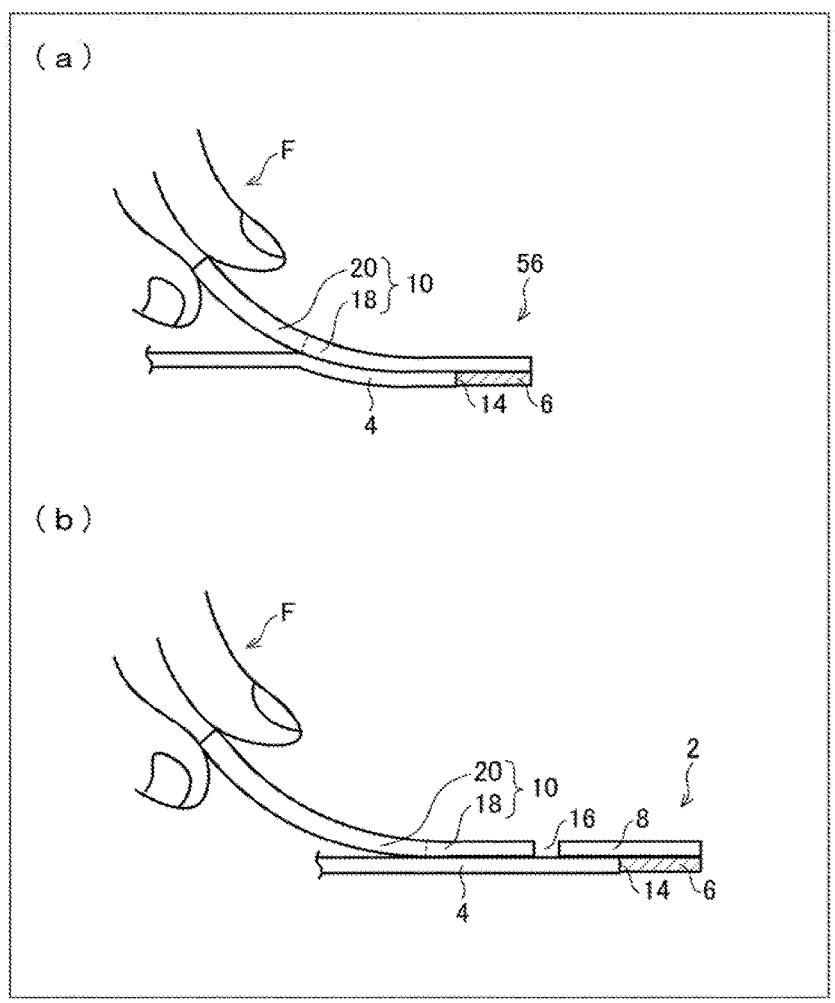
FIG. 3 is a view illustrating an effect of the flexible circuit board in accordance with Embodiment 1 of the present invention.

FIG. 3 is a view illustrating an effect of the flexible circuit board 2 in accordance with Embodiment 1. (a) and (b) of FIG. 3 each illustrate the flexible circuit board 56 or the flexible circuit board 2 in a state in which (i) a user of the flexible circuit board 56 or the flexible circuit board 2 holds the holding portion 20 with fingers F of the user and (ii) the flexible plate 10 is bent. (a) and (b) of FIG. 3 each illustrate a state in which the flexible circuit board 56 or the flexible circuit board 2 is viewed from a direction of a side surface of the flexible circuit board 56 or the flexible circuit board 2.

In the flexible circuit board 56 in accordance with the Comparative Embodiment, the above-described single flexible plate 10 includes both the bonding portion 18, which is bonded to the coverlay 4 and the terminal section 6, and the holding portion 20, which is to be held with fingers F. Accordingly, as illustrated in (a) of FIG. 3, when the flexible plate 10 is bent, the coverlay 4 bonded to the bonding portion 18 is also bent. This may consequently cause stress due to that bending to transmit and reach the boundary 14 between the coverlay 4 and the terminal section 6. In general, a conductor pattern at the boundary 14 has a lower structural strength as compared to a conductor pattern in the coverlay 4 and a conductor pattern which is exposed at the terminal section 6. Accordingly, in a case where the stress caused by bending of the coverlay 4 transmits and reaches the boundary 14, a disconnection may occur in the conductor pattern at the boundary 14.

In contrast, in the flexible circuit board 2 in accordance with Embodiment 1, the reinforcing plate 8, which is bonded to the coverlay 4 and the terminal section 6, is formed separately from the flexible plate 10 including the holding portion 20 which is to be held with fingers F. In addition, the reinforcing plate 8 and the flexible plate 10 are spaced apart from each other such that the gap 16 is provided between the reinforcing plate 8 and the flexible plate 10. Accordingly, as illustrated in (b) of FIG. 3, even when the flexible plate 10 is bent, it is difficult that stress is transmitted to the terminal section 6 and a terminal side portion of the coverlay 4 which terminal side portion is a portion which is closer to terminals than the gap 16. This is because bending of the coverlay 4 associated with bending of the flexible plate 10 is decreased via the gap 16.

Therefore, the flexible circuit board 2 in accordance with Embodiment 1 makes it possible to reduce the possibility of the occurrence of stress at the boundary 14 between the coverlay 4 and the terminal section 6 in a case where the flexible plate 10 is bent. The flexible circuit board 2 can thus reduce the possibility of disconnection in the conductor pattern at the boundary 14.

The above has discussed a case where the holding portion 20 is held with fingers F, but an embodiment of the present invention is not limited to such a configuration. The holding portion 20 may be held by a jig such as a manipulator for mounting by insertion the terminal section 6 to an external device. Further, it is possible to reduce the above-described effect of reducing the stress transmitted to the coverlay 4 and the terminal section 6 which stress occurs due to bending of the flexible plate 10 not only in a case where the flexible plate 10 is bent by holding of the holding portion 20 but also in a case where an external force is directly applied to the coverlay 4. Note that the length R of the gap 16 may be, for example, not less than 0.1 mm.

Embodiment 2

Figure 4:
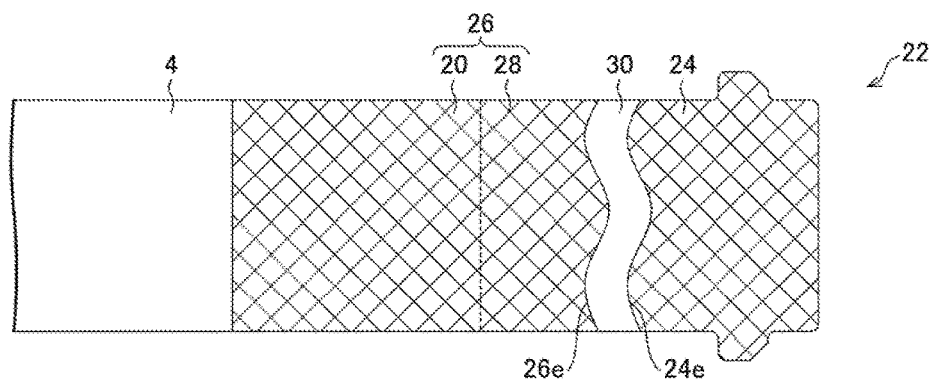
FIG. 4 is a schematic top view of a flexible circuit board in accordance with Embodiment 2 of the present invention.

FIG. 4 is a schematic top view of a flexible circuit board in accordance with Embodiment 2 of the present invention, for explaining the flexible circuit board 22. The flexible circuit board 22 in accordance with Embodiment 2 is different in configuration from the flexible circuit board 2 in accordance with Embodiment 1 only in that a reinforcing plate 24 is provided in place of the reinforcing plate 8 and that a flexible plate 26 is provided in place of the flexible plate 10.

As illustrated in FIG. 4, the reinforcing plate 24 is different from the reinforcing plate 8 only in that a coverlay-side edge 24e of the reinforcing plate 24, unlike the coverlay-4 side edge 8e of the reinforcing plate 8, is in a wavy shape, when viewed from above. The flexible plate 26 is different from the flexible plate 10 only in that the flexible plate 26 includes a bonding portion 28 having a terminal-section-6 side edge 26e in a wavy shape when viewed from above, which terminal-section-6 side edge 26e is an edge of the flexible plate 26. Except for the above differences, the reinforcing plate 24 and the flexible plate 26 are identical in configuration to the reinforcing plate 8 and the flexible plate 10, respectively.

A space between the coverlay-4 side edge 24e and the terminal-section-6 side edge 26e is defined as a gap 30. Since the coverlay-4 side edge 24e and the terminal-section-6 side edge 26e are each in a wavy shape when viewed from above, respective ends of the gap 30 on a terminal section 6 side and on a side on which the coverlay 4 stretches are also in the wavy shape when viewed from above, as illustrated in FIG. 4.

Note that in Embodiment 2, the coverlay-4 side edge 24e has a shape obtained by parallel translation of the terminal-section-6 side edge 26e toward a terminal section 6, as illustrated in FIG. 4. In other words, the shape of the coverlay-4 side edge 24e conforms to the shape of the terminal-section-6 side edge 26e. Since the distance between the coverlay-4 side edge 24e and the terminal-section-6 side edge 26e is thus substantially constant at any position, the width of the gap 30 is substantially constant at any position of the gap 30 in Embodiment 2.

In the flexible circuit board 22 in accordance with Embodiment 2, both of the respective ends of the gap 30 on the terminal section 6 side and on the side on which the coverlay 4 stretches are in the wavy shape when viewed from above. This allows for dispersion of stress which occurs at the coverlay-4 side edge 24e and the terminal-section-6 side edge 26e due to bending of the coverlay 4, in a case where the flexible plate 26 bends. Therefore, as compared to the flexible circuit board 2, the flexible circuit board 22 can increase the effect of reducing, via the gap 30, the stress caused by bending of the coverlay 4.

Note that, as illustrated in FIG. 4, since the shape of the coverlay-4 side edge 24e and the terminal-section-6 side edge 26e are identical to each other, the respective ends of the gap 30 on the terminal section 6 side and on the side on which the coverlay 4 stretches are also identical in shape to each other when viewed from above. Therefore, the width of the gap 30 is substantially constant at any position, so that stress concentration at a position in the gap 30 can be reduced when bending of the coverlay 4 is decreased. The above-described configuration, in which the respective ends of the gap have the same shape, is also applicable to the gap 16 in the above Embodiment 1.

Embodiment 3

Figure 5:
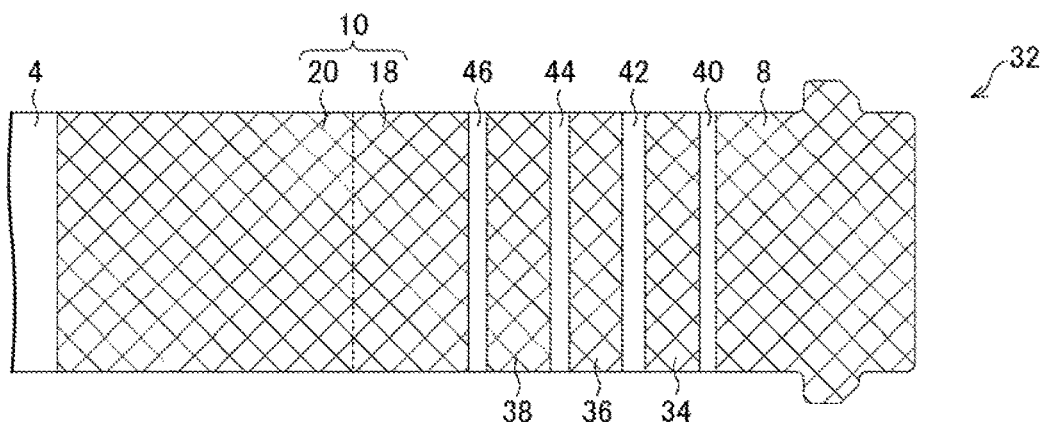
FIG. 5 is a schematic top view of a flexible circuit board in accordance with Embodiment 3 of the present invention.

FIG. 5 is a schematic top view of a flexible circuit board in accordance with Embodiment 3 of the present invention, for explaining the flexible circuit board 32. The flexible circuit board 32 in accordance with Embodiment 3 is different in configuration from the flexible circuit board 2 in accordance with Embodiment 1 only in that the flexible circuit board 32 includes a plurality of auxiliary plates 34, 36, and 38 such that the auxiliary plates 34, 36 and 38 are bonded to an upper surface of a coverlay 4.

The auxiliary plates 34, 36 and 38 are bonded between a reinforcing plate 8 and a flexible plate 10 in this order from a position closer to a terminal section 6. The auxiliary plates 34, 36 and 38 are each spaced apart from an adjacent auxiliary plate(s). Further, the auxiliary plate 34 is spaced apart from the reinforcing plate 8, and the auxiliary plate 38 is spaced apart from the flexible plate 10. Therefore, between each adjacent two of the reinforcing plate 8, the auxiliary plates 34, 36 and 38, and the flexible plate 10, a gap 40, 42, 44 or 46 is defined. Each of the gaps 40, 42, 44 and 46 has respective ends on a terminal section 6 side and on a side on which the coverlay 4 stretches. When viewed from above, the ends may be in the shape of a straight line as illustrated in FIG. 5, or may alternatively be in a wavy shape. Note that the auxiliary plates 34, 36 and 38 may contain the same material as the reinforcing plate 8 or the flexible plate 10.

The flexible circuit board 32 in accordance with Embodiment 3 includes the auxiliary plates 34, 36 and 38 which are spaced apart from each another, between the reinforcing plate 8 and the flexible plate 10. Therefore, as compared to the flexible circuit board 2, the flexible circuit board 32 can increase the number of gaps between the reinforcing plate 8 and the flexible plate 10 while respective structures of the coverlay 4 and the terminal section 6 are reinforced.

In other words, the flexible circuit board 32 can reduce stress caused by bending of the coverlay 4, via each of the gaps 40, 42, 44 and 46. Therefore, the flexible circuit board 32 can further increase the effect of reducing the stress caused by bending of the coverlay 4, as compared to the flexible circuit board 2. In Embodiment 3, it is possible to advantageously produce the effect of reducing stress caused by bending of the coverlay 4 and consequently reducing the occurrence of disconnection in a conductor pattern, for example, even in a case where the flexible plate 10 bends to a larger degree.

Note that though Embodiment 3 has discussed above a configuration including a plurality of auxiliary plates in the flexible circuit board 32, an embodiment of the present invention is not limited to such a configuration. An embodiment of the present invention may be configured to include a single auxiliary plate. Even in this case, it is possible to provide a flexible circuit board 32 which includes two gaps, one of which is between the reinforcing plate 8 and the single auxiliary plate and the other one of which is between the auxiliary plate and the flexible plate 10.

Embodiment 4

Figure 6:
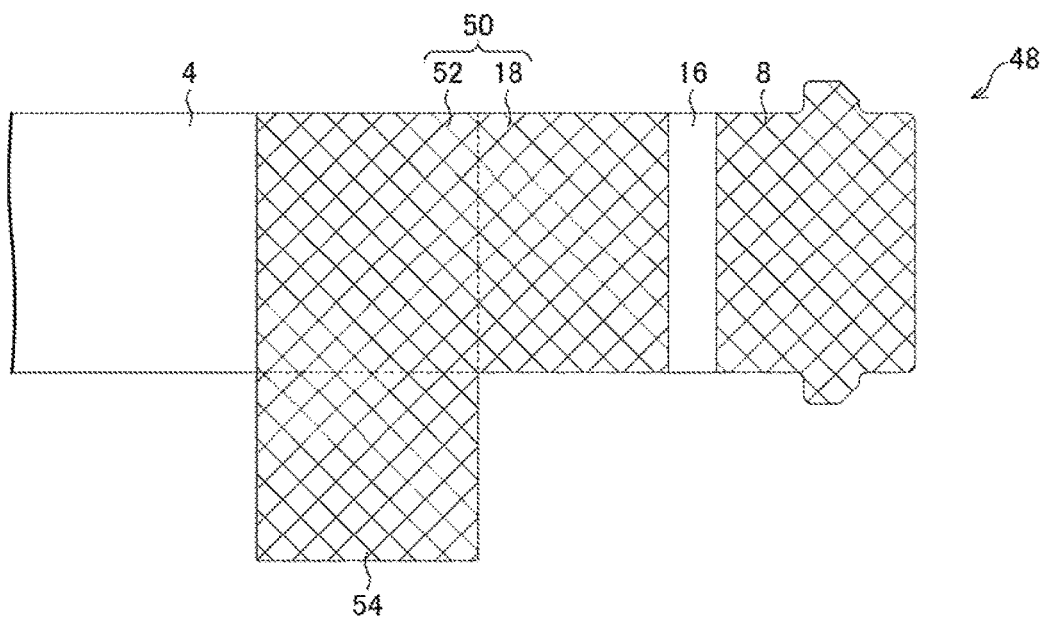
FIG. 6 is a schematic top view of a flexible circuit board in accordance with Embodiment 4 of the present invention.

FIG. 6 is a schematic top view of a flexible circuit board in accordance with Embodiment 4 of the present invention, for explaining the flexible circuit board 48. The flexible circuit board 48 in accordance with Embodiment 4 is different in configuration from the flexible circuit board 2 in accordance with Embodiment 1 only in that a flexible plate 50 is provided in place of the flexible plate 10. The flexible plate 50 is different in configuration from the flexible plate 10 only in that the flexible plate 50 includes a holding portion 52 in place of the holding portion 20.

The holding portion 52 includes a protruding portion 54 which protrudes from a coverlay 4 as illustrated in FIG. 6 when viewed from above. When the protruding portion 54 of the holding portion 52 is held and an external force is applied in a direction away from the coverlay 4, the holding portion 52 and furthermore the flexible plate 50 bends.

The flexible circuit board 48 in accordance with Embodiment 4 allows the flexible plate 50 to be bent by application of an external force to the protruding portion 54 which protrudes from the coverlay 4 when viewed from above. Accordingly, in a case where the flexible plate 50 is bent by application of an external force, it is possible to reduce stress which is caused by application of an external force to the protruding portion 54 and transmitted to the coverlay 4 and a terminal section 6. Therefore, the flexible circuit board 48 can further increase the effect of reducing the stress caused by bending of the coverlay 4 as compared to the flexible circuit board 2. The protruding portion 54 does not overlap the coverlay 4. Accordingly, the coverlay 4 does not hinder when the protruding portion 54 is to be held in a state in which the flexible plate 50 is not bent. This makes it easy to hold the holding portion 52.

[Recap]

A flexible circuit board in accordance with Aspect 1 of the present invention includes: a coverlay in which a conductor pattern is provided; a terminal section including the conductor pattern which is exposed from the coverlay; a reinforcing plate being provided at one of an upper surface and a lower surface of the flexible circuit board and bonded to a whole of the terminal section and a portion of the coverlay; and a flexible plate including a holding portion and a bonding portion, the bonding portion being provided on a terminal section side of the flexible plate relative to the holding portion, the flexible plate bonding, at the one surface of the flexible circuit board, to the coverlay via only the bonding portion, the flexible plate being spaced apart from the reinforcing plate in a direction from the terminal section to the coverlay.

The above configuration provides a flexible circuit board which decreases bending of the coverlay between the reinforcing plate and the flexible plate and accordingly reduces stress transmitted from the coverlay to the terminal section in a case where an external force which causes the coverlay to bend is applied to the flexible circuit board.

A flexible circuit board in accordance with Aspect 2 of the present invention may be configured such that: in the above Aspect 1, the flexible plate is bent by force which is applied to the holding portion in a direction away from the one surface along a vertical direction.

The above configuration makes it possible to handle the terminal section by holding the holding portion with fingers of a user or by a jig.

A flexible circuit board in accordance with Aspect 3 of the present invention may be configured such that: in the above Aspect 1 or 2, a coverlay side edge of the reinforcing plate is identical in shape to a terminal-section side edge of the flexible plate, when viewed from above.

In the above configuration, the width of a gap is substantially constant at any position of the gap. This makes it possible to reduce stress concentration at a position in the gap when bending of the coverlay is decreased.

A flexible circuit board in accordance with Aspect 4 of the present invention may be configured such that: in any one of the above Aspects 1 to 3, both of a coverlay side edge of the reinforcing plate and a terminal-section side edge of the flexible plate are in a wavy shape, when viewed from above.

The above configuration makes it possible to reduce the possibility of stress concentration at a position between ends of the gap.

A flexible circuit board in accordance with Aspect 5 of the present invention may be configured to further include: in any one of the above Aspects 1 to 4, an auxiliary plate bonded to the coverlay between the reinforcing plate and the flexible plate, the auxiliary plate being spaced apart from the reinforcing plate and the flexible plate.

In the above configuration, a plurality of gaps can be formed. This makes it possible to increase the above-described effect of reducing stress via the gaps.

A flexible circuit board in accordance with Aspect 6 of the present invention may be configured such that: in any one of the above Aspects 1 to 5, a plurality of the auxiliary plates are provided.

In the above configuration, the numbery of gaps can be further increased. This makes it possible to increase the above-described effect of reducing stress via the gaps.

A flexible circuit board in accordance with Aspect 7 of the present invention may be configured such that: in any one of the above Aspects 1 to 6, the holding portion includes a protruding portion which protrudes from the coverlay, when viewed from above.

In the above configuration, the protruding portion is held and the flexible plate is bent. This makes it possible to reduce stress which occurs in the coverlay and the terminal section. Since the protruding portion is held, the coverlay does not hinder when the flexible plate is held. Therefore, the flexible plate can be easily held.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST 2, 22, 32, 48 flexible circuit board
4 coverlay
6 terminal section
8, 24 reinforcing plate
10, 26, 50 flexible plate
18, 28 bonding portion
20, 52 holding portion
34, 36, 38 auxiliary plate
54 protruding portion

The invention claimed is:

1. A flexible circuit board comprising:
a coverlay in which a conductor pattern is provided;
a terminal section including the conductor pattern which is exposed from the coverlay;
a reinforcing plate being provided at one of an upper surface and a lower surface of the flexible circuit board and bonded to a whole of the terminal section and a portion of the coverlay; and
a flexible plate including a holding portion and a bonding portion, the bonding portion being provided on a terminal section side of the flexible plate relative to the holding portion, the flexible plate bonding, at the one surface of the flexible circuit board, to the coverlay via only the bonding portion, the flexible plate being spaced apart from the reinforcing plate in a direction from the terminal section to the coverlay.

2. The flexible circuit board as set forth in claim 1, wherein:
the flexible plate is bent by force which is applied to the holding portion in a direction away from the one surface along a vertical direction.

3. The flexible circuit board as set forth in claim 1, wherein:
a coverlay side edge of the reinforcing plate is identical in shape to a terminal-section side edge of the flexible plate, when viewed from above.

4. The flexible circuit board as set forth in claim 1, wherein:
both of a coverlay side edge of the reinforcing plate and a terminal-section side edge of the flexible plate are in a wavy shape, when viewed from above.

5. The flexible circuit board as set forth in claim 1, further comprising:
an auxiliary plate bonded to the coverlay between the reinforcing plate and the flexible plate, the auxiliary plate being spaced apart from the reinforcing plate and the flexible plate.

6. The flexible circuit board as set forth in claim 5, wherein:
a plurality of the auxiliary plates are provided.

7. The flexible circuit board as set forth in claim 1, wherein:
the holding portion includes a protruding portion which protrudes from the coverlay, when viewed from above.

* * * * *